United States Patent
Hess et al.

(10) Patent No.: US 10,354,781 B2
(45) Date of Patent: *Jul. 16, 2019

(54) CABLE WITH AN INTEGRATED COILING AND REINFORCING WRAPPER

(71) Applicant: BBY SOLUTIONS, INC., Richfield, MN (US)

(72) Inventors: Matthew Hess, Burnsville, MN (US); Joseph Tseng, Taipei (TW); Kris Verstockt, Taipei (TW); Hui-Hsiu Hsu, Yilan County (TW); Daowu Ye, Shenzhen (CN)

(73) Assignee: BBY SOLUTIONS, INC., Richfield, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/661,298

(22) Filed: Jul. 27, 2017

(65) Prior Publication Data

US 2017/0338012 A1 Nov. 23, 2017

Related U.S. Application Data

(62) Division of application No. 14/870,056, filed on Sep. 30, 2015, now Pat. No. 9,741,473.

(51) Int. Cl.
| | |
|---|---|
| *H01B 13/24* | (2006.01) |
| *H01B 3/28* | (2006.01) |
| *H01B 3/47* | (2006.01) |
| *H01B 7/40* | (2006.01) |
| *H01B 1/02* | (2006.01) |
| *H01B 3/30* | (2006.01) |
| *H05K 9/00* | (2006.01) |

(52) U.S. Cl.
CPC .............. *H01B 13/24* (2013.01); *H01B 1/026* (2013.01); *H01B 3/28* (2013.01); *H01B 3/30* (2013.01); *H01B 3/47* (2013.01); *H01B 7/40* (2013.01); *H05K 9/0088* (2013.01)

(58) Field of Classification Search
CPC .......... H01B 13/24; H01B 1/026; H01B 3/28; H01B 3/30; H01B 3/47; H01B 7/40; H05K 9/0088
USPC ...................................................... 174/74 A
See application file for complete search history.

(56) References Cited

U.S. PATENT DOCUMENTS

| | | | |
|---|---|---|---|
| 5,437,899 A | 8/1995 | Quigley | |
| 5,577,932 A * | 11/1996 | Palmer | H01B 7/06 206/702 |
| 5,917,151 A * | 6/1999 | O'Brien | B60R 16/02 174/72 A |

(Continued)

OTHER PUBLICATIONS

Dec. 16, 2016 USPTO Office Action (U.S. Appl. No. 14/870,056).

(Continued)

*Primary Examiner* — Andargie M Aychillhum
*Assistant Examiner* — Michael F McAllister
(74) *Attorney, Agent, or Firm* — Tysver Beck Evans, PLLC

(57) ABSTRACT

The present invention is a cable, which carries signal, having an integrated coiling and reinforcing wrapper. The cable has a segment near an end that is stiffer than the cable generally. This segment can be bent by hand, and once bent, will retain its bent shape. If the flexible part of the cable is wrapped into a coil, or otherwise gathered together, then the stiffer portion can be bent around the gathered portion to secure it in its gathered form.

18 Claims, 7 Drawing Sheets

(56) References Cited

U.S. PATENT DOCUMENTS

| | | | | |
|---|---|---|---|---|
| 8,399,769 B2* | 3/2013 | Doll | ............... | H04R 1/1033 |
| | | | | 174/110 R |
| 8,908,898 B2* | 12/2014 | Im | ............... | H04R 1/1033 |
| | | | | 174/70 R |
| 2007/0034400 A1* | 2/2007 | Rivera | ............... | B65H 75/36 |
| | | | | 174/138 G |
| 2008/0008430 A1* | 1/2008 | Kewitsch | ............... | G02B 6/4478 |
| | | | | 385/113 |
| 2008/0250632 A1* | 10/2008 | Dayton | ............... | H01B 7/40 |
| | | | | 29/825 |
| 2009/0104945 A1* | 4/2009 | Axelsson | ............... | H01B 7/40 |
| | | | | 455/569.1 |
| 2010/0006320 A1* | 1/2010 | Tatsumi | ............... | H01B 7/06 |
| | | | | 174/113 R |
| 2010/0104126 A1* | 4/2010 | Greene | ............... | H01B 7/225 |
| | | | | 381/384 |
| 2011/0051973 A1* | 3/2011 | Liu | ............... | B82Y 30/00 |
| | | | | 381/370 |
| 2011/0308835 A1* | 12/2011 | Piekny | ............... | B65H 75/36 |
| | | | | 174/69 |
| 2012/0241195 A1* | 9/2012 | Doll | ............... | H04R 1/1033 |
| | | | | 174/135 |
| 2014/0069680 A1* | 3/2014 | Alshinnawi | ............... | H02G 11/003 |
| | | | | 174/82 |
| 2014/0274221 A1 | 9/2014 | Baschnagel | | |
| 2016/0265093 A1* | 9/2016 | Ueland | ............... | A61L 31/022 |

OTHER PUBLICATIONS

Mar. 24, 2016 USPTO Office Action (U.S. Appl. No. 14/870,056).
Save your power cables with a little help from twist-ties (http://www.techhive.com/article/2082963/save-your-power-cables-with-a-little-help-from-twist-ties.html).

* cited by examiner

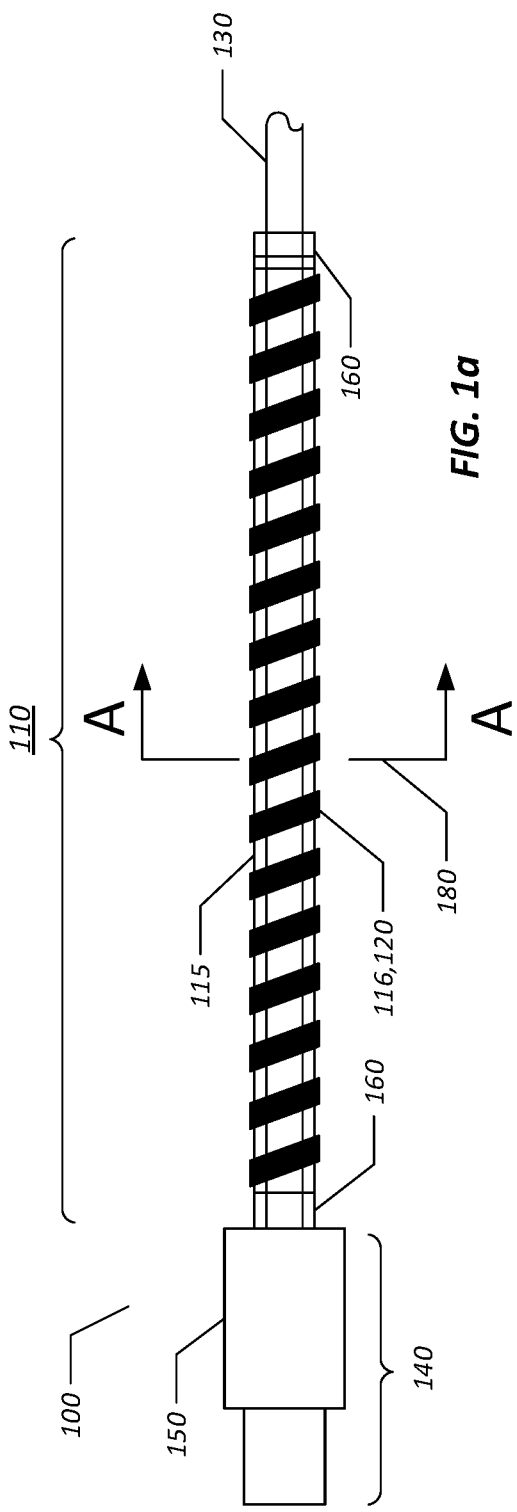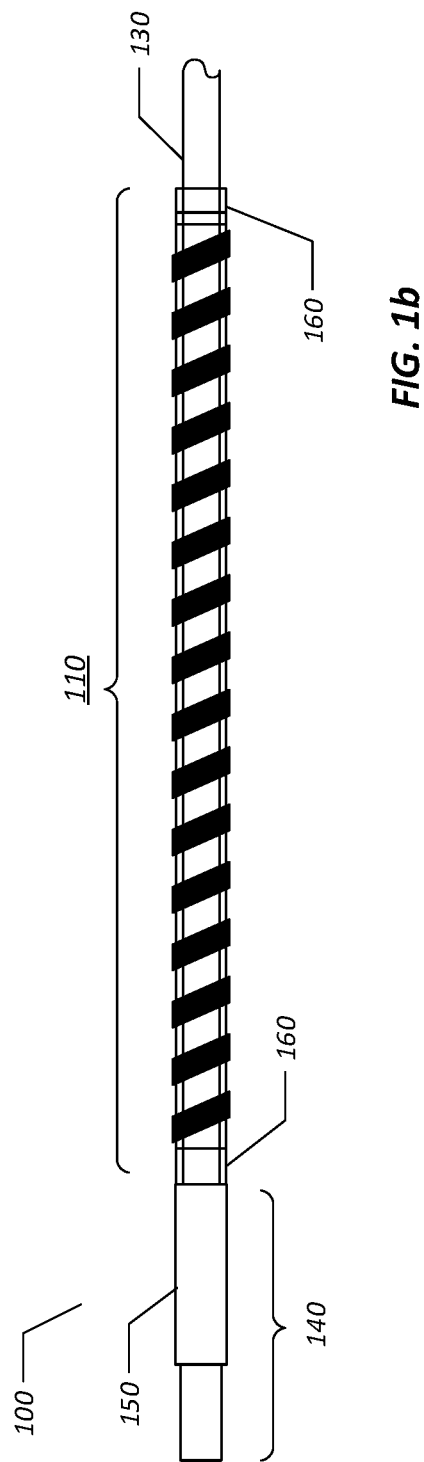

CABLE WITH AN INTEGRATED COILING AND REINFORCING WRAPPER

CROSS-REFERENCE TO RELATED APPLICATION

This application is a divisional application of U.S. patent application Ser. No. 14/870,056 (the '056 application), filed Sep. 30, 2015, now issued as U.S. Pat. No. 9,741,473. The '056 application claimed the filing date of U.S. Provisional Application 62/090,110 (the '110 application), which was filed Dec. 10, 2014. The current application hereby claims the benefit of the filing date of the '110 application, and incorporates the '056 application by reference in its entirety.

FIELD OF THE INVENTION

The present invention relates to cables that carry signal. More specifically, it relates to a adaptation for reinforcing and coiling such cable.

SUMMARY OF THE INVENTION

The present invention is a cable with an integrated coiling and reinforcing wrapper. The cable carries "signal," which we define to include at least data, electricity, light, and audio/video information.

The cable has a segment near an end that is stiffer than the cable generally. This segment can be bent by hand, and once bent, will essentially retain its bent shape. If the flexible part of the cable is gathered or wrapped into a coil (which we define to include a z-fold or other gathering or bundle), then the stiff portion can be bent around the coil to secure the coil in place.

As an exemplary embodiment, consider a data cable. The flexible section may be surrounded by an outer jacket, possibly fabricated from a polymer or from rubber. To produce a stiff wrapper near a connector at an end of the cable, the outer jacket might be replaced or augmented in the stiff segment with a component into which a length of bendable but relatively stiff wire (e.g., copper or copper alloy wire) is molded. The stiff segment might be surrounded with a shrink-wrap or injection-molded covering (e.g., rubber or polymer) that holds everything in place.

BRIEF DESCRIPTION OF THE DRAWINGS

FIG. 1a is a top view of a cable that includes an integrated coiling and reinforcing wrapper.

FIG. 1b is a side view of a cable that includes an integrated coiling and reinforcing wrapper.

DETAILED DESCRIPTION OF EXEMPLARY EMBODIMENTS

Figure 2:
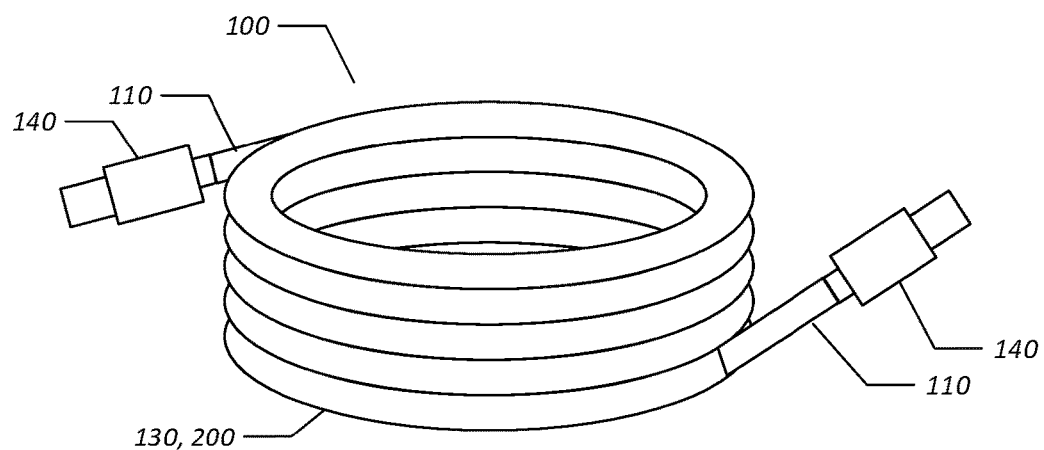
FIG. 2 is a perspective view of a cable that includes integrated coiling and reinforcing wrappers on each end, showing a flexible segment in a coiled form.

This description provides embodiments of the invention intended as exemplary applications. The reader of ordinary skill in the art will realize that the invention has broader scope than the particular examples described here. It should be noted from the outset that the drawings, and the elements depicted by the drawings, are not to scale.

Cables in common transmit "signal"—e.g., light, sound, video, electricity, and/or data. Such cables include, for example, Universal Serial Bus (USB) cables, power cords, audio and/or video cables, data cables, and fiber optic cables. All these cables terminate at one end, or at each end, with a connector or jack.

Such cables are prone to deterioration and breakage near the critical point where the flexible portion of the cable enters the connector. Some cables relieve this problem with reinforcement near the critical point, but such reinforcements are designed specifically to resist bending so as retain their shape. Without reinforcement, many cables eventually fray or even break near the critical point.

A user needs a cable that is long enough for each of their particular usages, but it is rare that an off-the-shelf cable will be exactly the right length for every use (or for even one use). A longer cable gives us more usage options, but has the side-effect of excess cable length. As a practical matter, for anyone with a collection of computers and peripherals, unsightly cables seem to be everywhere. One solution is to coil the excess length, and then wrap the coil with some external wrapper, such as a strap or a twist tie. Such external wrapper items are easy to lose or misplace. Also, coiling the wire may actually exacerbate the deterioration problem in the critical area near the connector.

FIGS. 1a and 1b are top and side views, respectively, of one end of an illustrative cable with an integrated coiling and reinforcing wrapper (hereinafter "w-cable") 100, which we may sometimes refer to as a "stiffened cable". The cable 100 includes an integrated stiffened segment 110, which protects the core 400 of the cable in the critical area where the cable attaches to the connector 140. The core 400 of the cable is the inner portion, operative to carry signal. The core 400 may include, for example, wires, sheathing, and/or insulation. Outside the critical area, in flexible segment 130, the cable 100 has ordinary cable construction. The particular exemplary cable shown is a USB cable, which has a case 150 over a portion of the connector 140. In some embodiments, such a case might cover a portion of the stiffened segment 110. Either end or both ends, of the stiffened segment 110 may be capped with an annulus- or donut-shaped cap, whose purpose is to retain the components of the stiffened segment 110 in position when the cable 100 is in use, preventing radial, circumferential, and longitudinal stretching and shifting.

FIG. 2 is a perspective view of an illustrative cable 100 in a coiled form. The coil 200 in the figure is a "straight coil" or spool. However, we mean the word "coil" in a broader sense; namely, a gathering up at least a portion of the length of the cable. Such other types of coiling include, for example, over/under coiling, z-folding, and more-or-less haphazard bunching of the cable.

This particular cable 100 has a stiffened segment 110 on each end, proximate or adjacent to the respective connector 140. When feasible, this arrangement has the advantages of protecting both ends of the cable, and of allowing the excess slack to be taken out of the cable at either end. In some cases, the cable 100 may be permanently attached to a device at one end—for example, a power cord attached to a desk lamp.

In any case, at least one end of a cable 100 will have a stiffened segment 110. We will refer to such end of the cable 100 as the "proximal" end. The other end will be referred to as the "distal" end.

Figure 3:
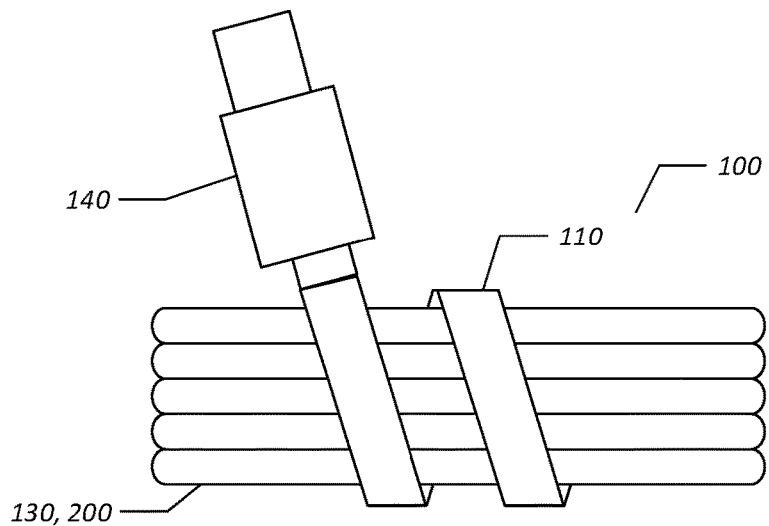
FIG. 3 is a side view of a cable, with a stiffer segment wrapped around the flexible segment, securing it in coiled form.

FIG. 3 shows a coil 200 from the side, with the stiffened segment 110 of an illustrative cable 100 bent around the flexible segment 130. If the coil 200 here were viewed from the top (not shown), it might have approximately the shape of an hourglass or the numeral '8'. The stiffened segment 110 of a cable 100 is flexible enough to be bent by hand around the flexible segment 130, or a portion thereof. The stiffened segment 110 secures the cable 100 in the coil 200 configuration. Once the stiffened segment 110 is bent into another shape, it retains that shape (or essentially retains that shape) until bent again. From the coiled and wrapped configuration, the stiffened segment 110 can be unwound by hand from around the coil 200, releasing the flexible segment 130.

Figure 4:
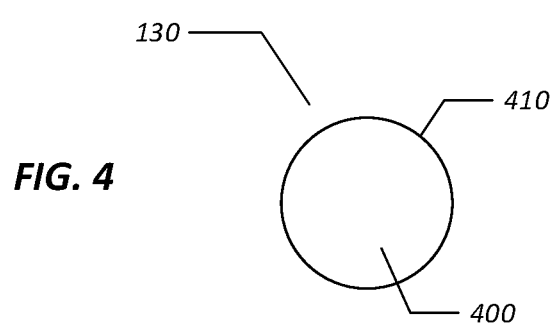
FIG. 4 is a conceptual cross section through an exemplary flexible segment of a cable that includes an integrated coiling and reinforcing wrapper.
Figure 5:
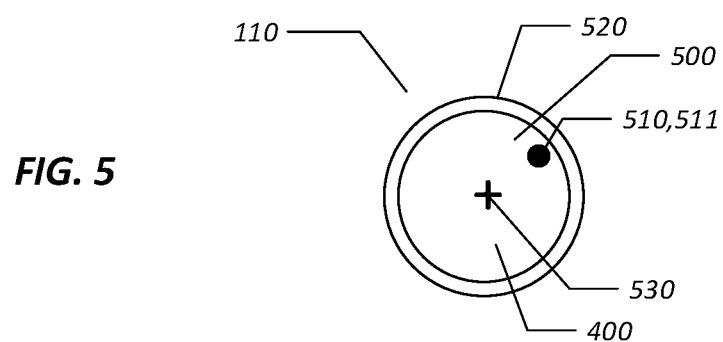
FIG. 5 is a conceptual cross section through an exemplary stiffened segment of a cable that includes an integrated coiling and reinforcing wrapper.

FIG. 4 is a cross section through the flexible segment 130 of an exemplary cable 100. For illustration, the layers in FIGS. 4 and 5 are circular, but that is not a restriction on the scope of the invention. These layers might have various shapes in cross section. The flexible segment 130 of the figure has a flexible jacket 410 enclosing a core 400. The core 400 might include a plurality of components. The components might include, for example, wire, glass, sheathing, and insulation. There might be voids filled with air or other gas(es).

FIG. 5 is a cross section through the stiffened segment 110 of an exemplary cable 100. The illustrated flexible segment 130 includes a stiffening layer 500 and a sheath 520 or jacket that surround and protect the core 400. The stiffening layer 500 provides the stiffness, while allowing the cable 100 to bend and wrap the flexible segment 130 when the flexible segment 130 is coiled. When bent into a configuration, the stiffened segment 110 retains, or essentially retains, its bent shape. And the stiffened segment 110 can be bent back into a shape resembling its shape before the bending, releasing the flexible segment 130 to uncoil.

In FIG. 5, the stiffened segment 110 is stiffened with a stiffening component 511; for example, a wire 510 embedded in its stiffening layer 500. In the embodiment shown in the figure, the wire 510 is copper or copper alloy, and runs essentially parallel to the axis 530 of the cable. The wire 510 is embedded integrally in the stiffening layer 500.

The material, shape, and layout of the stiffening component 511 within the stiffening layer 500 may vary. For example, the wire 510 (or any other stiffening component 511) might be made, in whole or in part, from, e.g., some other metal; or from polymer, glass, rubber, or fiberglass. The wire 510 might not run parallel to the axis 530 of the cable 100; for example, the wire 510 might wrap the core 400 following a spiral path such as illustrated by spiral ribbing 120 of FIG. 1a and FIG. 1b. The wire 510 might have a non-circular cross section, or have a cross section that varies in shape or area along the axis. The stiffening component 511 might have some entirely different shape, such as a tube that encircles the axis. The stiffening component 511 might or might not extend the entire length of the stiffened segment 110. Preferably, the stiffening layer 500 is primarily formed from a polymer, with the stiffening component 511 embedded.

In some embodiments, there might be a plurality of stiffening component 511s, which might or might not be of the same type, geometry, or layout within the cable. As a simple example, consider a stiffening layer 500 with 3 wires, each parallel to the axis 530, arranged at equal angles about the axis 530. The stiffening layer 500 itself might be composed of materials, such as a polymer or a metal (or composition/compound) thereof, so that no stiffening component 511, distinct from the layer itself, is required.

Each of the three layers may include at least one material that differs in a physical or chemical property from all materials in the other two layers. Preferably, the sheath 520 and stiffening layer 500 each include a polymer of different composition from the other. The sheath 520, or outer layer, might also be fabricated primarily from fiberglass, carbon and fiber, fiber, or rubber.

Preferably, the stiffening layer 500 is formed by joint extrusion of the stiffening component 511 (e.g., wire) together with a polymer in which the stiffening component 511 is embedded.

Preferably, the sheath 520 is formed primarily from polymer by plastic injection molding, which also bonds the sheath 520 to the stiffening layer 500 and, if in direct contact, to the core 400 layer. Alternatively, this bonding might be formed, at least in part, by melting, by welding, or by an adhesive.

Figure 6:
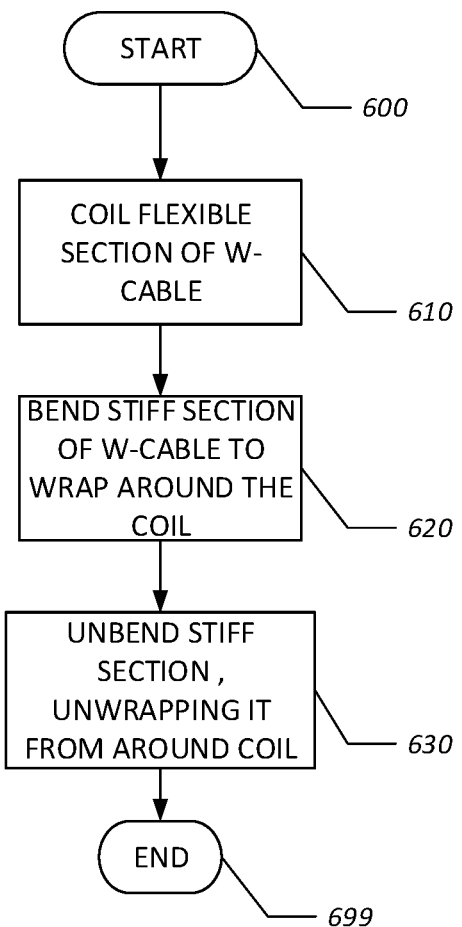
FIG. 6 is a flowchart illustrating the coiling of a w-cable and securing the coil with the stiff section, then unwrapping the stiff segment from around the coil.

FIG. 6 is a flowchart showing the use of wrapping to eliminate excess length in a cable 100. After the start 600, the flexible segment 130 (or a portion thereof) is formed 610 into a coil 200. The stiffened segment 110 is bent 620 and wrapped around it. To release the coiled part, the stiffened segment 110 is unwrapped 630 from the coil 200. The process ends 699.

Figures 7, 8:
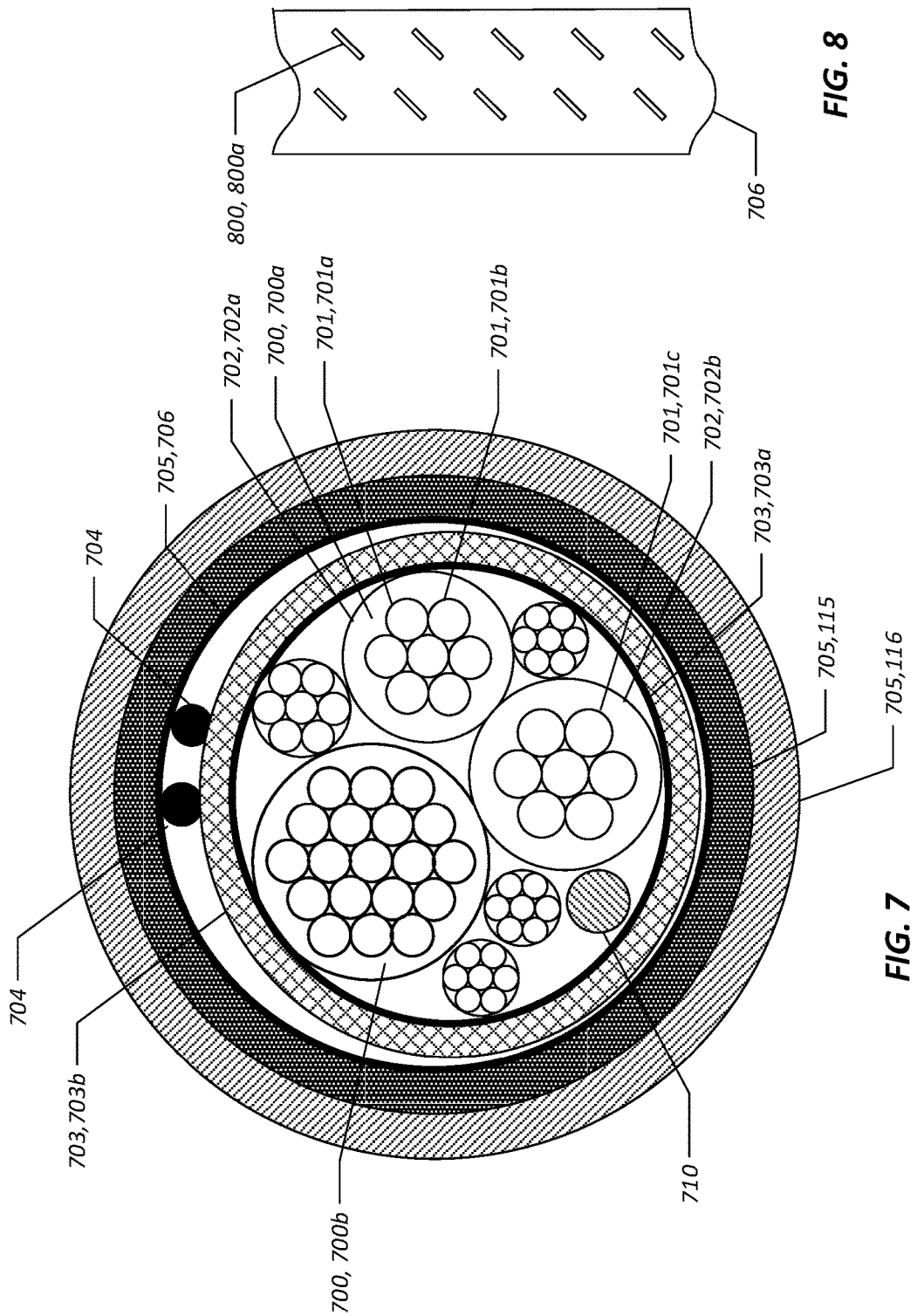
FIG. 7 is a detailed cross section through an exemplary stiffened segment of a cable that includes an integrated coiling and reinforcing wrapper.
FIG. 8 is a view of an opened and flattened segment of a middle flex layer, which illustrates slits that integrate the middle flex layer to the outer flex layer.
Figure 10A:
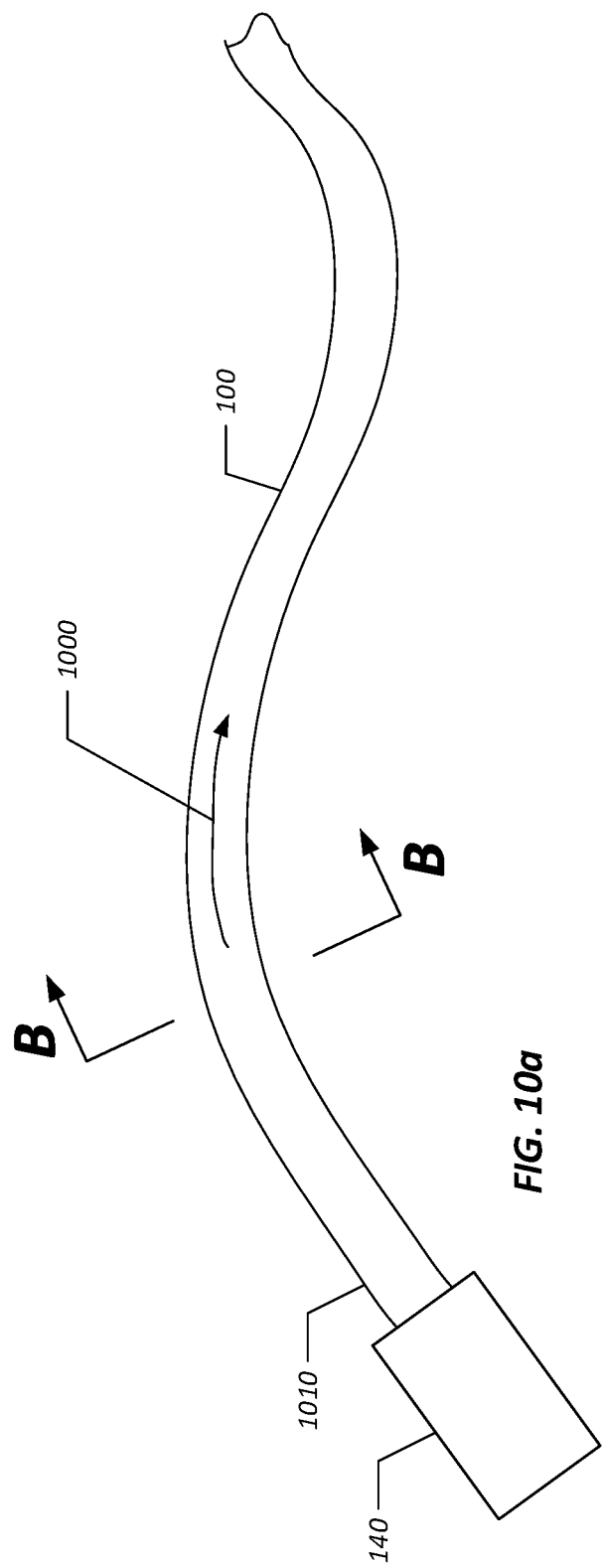
FIG. 10a is a conceptual diagram illustrating aspects of a cyllindrical coordinate system as applied to a cable.
Figure 10B:
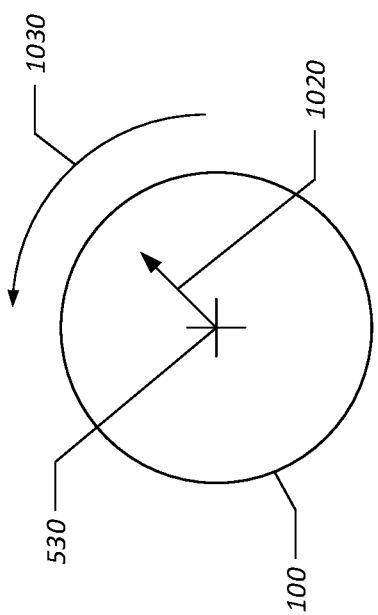
FIG. 10b is a conceptual diagram illustrating a cross section through the cable of the previous figure, showing additional aspects of a cyllindrical coordinate system.

FIG. 7 is a detailed cross section through an exemplary stiffened segment of a cable that includes an integrated coiling and reinforcing wrapper, for example, through section A of FIG. 1a. The cylindrical coordinate system shown in FIG. 10a and FIG. 10b provides a reference for describing FIG. 7. FIG. 10a shows a portion of cable 100 with a connector 140 at the left end. The portion of the cable 100 toward the connector 140 is the proximal end 1010. Arrow 1000 points in the longitudinal direction, distally along the axis 530 of the cable 100. FIG. 10b is a cross section through the cable at B-B. The radial direction is outward from the axis 530, as illustrated by arrow 1020. The azimuthal direction represents an angle from some reference direction, as illustrated by arrow 1030.

The cable 100 may contain one or more conductor wires 700, typified by 700a and 700b, extending longitudinally. We use the word "wire" here in a general sense, meaning something that carries signal, data, or information through one or more conductors 701, typified by 701a, 701b, and 701b. A conductor 701 may include any material, such as metal, metal allow, glass, fiberglass, or some combination thereof. A conductor 701 might carry, for example, electricity, video, sound, light, or power, in analog or digital form. A conductor wire 700 might include one or more fillers 710 for spacing or to protect the conductors 701. A conductor wire 700 may include a wire sheath 702, an outer wrapping to contain and secure the conductors 701. The wire sheath 702 might include materials or be structured to shield the conductors 701; for example, the wire sheath 702 might prevent electromagnetic radiation from escaping, or incoming radiation from affecting transmissions through the conductor wire 700.

Likewise, the collection of conductor wires 700 may be wrapped by one or more jackets 703, such as inner jacket 703a and outer jacket 703b, forming with their contents a wire assembly. A jacket 703 might serve the purpose of shielding, retention of contents, or both. In the illustrated embodiment, inner jacket 703a retains the collection of conductors 701, while the outer jacket 703b is formed from a braided material for shielding against electromagnetic interference. The inner jacket 703a may also have a shielding function, and might be made from foil shield.

The stiffened cable may have one or more flexible layers 705 that enclose the wire assembly. A flexible layers 705 bend easily by hand. A flexible layer 705 might be applied in a variety of ways. For example, a flexible layer 705 might be formed by plastic injection of a tube directly around the current assembly—that is, the wire assembly plus any flexible layer 705 and stiffeners 704 already incorporated at the time when the flexible layer 705 is added. A flexible layer 705 might be formed by molding as a tube separately, and then pulled over the current assembly. A flexible layer 705 might be formed as a strip of material, such as a flat strip, which could then be wrapped around the current assembly and glued or welded to enclose the current assembly. Like a jacket 703, a particular flexible layer 705 might serve the purpose of protecting, retaining, and or shielding its contents, depending upon material or structure (e.g., braiding).

In embodiments illustrated by FIG. 7, there are three flexible layers 705: a wrapper layer 706, an inner grip layer 115 and an outer grip layer 116. The wrapper layer 706 wraps the wire assembly, and the stiffeners 704. A stiffener 704 might be formed of metal, such as a metal (e.g., copper, tin, aluminum, steel, or some combination or alloy of metals) wire, or any other material that can easily be bent by hand, but which essentially retains its shape once bent. There may be one stiffener 704 or a plurality of stiffeners 704. Two stiffeners 704 might have the same or different properties, such as composition, size, and/or shape. The stiffeners 704 may be separate, or intertwined or braided together. In FIG. 7, there are two stiffeners 704 formed of copper wire. These stiffeners 704 may be wrapped around the wire assembly, along the length of the stiffened segment of the cable, approximately spiraling along that length. The stiffeners 704 may or may not be braided together.

The wrapper layer 706 in FIG. 7 retains its contents, the wire assembly and the stiffeners 704. Depending upon material and structure, the wrapper layer 706 may serve as a shield against electromagnetic interference, and might be made primarily of foil shield. At this point we should note that FIG. 7 is simplified for illustration purposes. Empty space is shown around the two stiffeners 704, while in reality, the wrapper layer 706 might be applied tightly so as to eliminate such space. The wrapper layer 706 will preferably be flexible, and may be applied by shrink wrapping.

The inner grip layer 115 in FIG. 7 protects its contents during use of the stiffened cable. It is made of a flexible material, such as polymer, rubber, cloth braid, nylon, or polyester. The flexibility allows it to be bent, and held in shape once bent by the stiffeners 704. It is sufficiently thick to serve a cushioning function. Preferably, the inner grip layer 115 is soft to the touch. The illustrative inner grip layer 115 of FIG. 1a is tubular, and extends over the length of the stiffened segment. As illustrated by FIG. 8, a inner grip layer 115 may have bonding slits 800, as typified by slit 800a, to facilitate bonding between the inner grip layer 115 and the outer grip layer 116. If the outer grip layer 116 is injection-molded onto the inner grip layer 115, molten material of the outer grip layer 116 may pour into the bonding slits 800, and upon cooling serve to lock the layers together. Of course, shapes other than slits might work as well.

An outer grip layer 116, such as the spiral ribbing 120 of FIG. 1a, is optional. Although an outer grip layer 116 may be largely decorative, it does add additional protection during use of the cable for the layers that it wraps. a spiral arrangement makes the stiffened segment 110 easy to grip, especially if the material of the outer grip layer 116 is soft to the touch compared to, for example, a metal wire. Preferably, the inner grip layer 115 and the outer grip layer 116 will each have a respective Shore durometer between 25 and 75 on the A scale.

As shown in FIG. 1a, either or both ends of the stiffened segment 110 may be terminated with an end cap 160. The end cap 160 retains the various layers of the stiffened segment 110, including any stiffener 704 from moving longitudinally along the cable. Typically, an end cap 160 will have a donut or ring shape, thereby allowing the conductors 701 to exit the stiffened segment. For example, the conductors 701 might be coupled to a connector 140, such as a USB connector, by (for example) soldering. An end cap 160 might be attached to the stiffened segment by jacket or by an adhesive substance, such as glue.

The cross section of FIG. 7 can be regarded as a sequence of layers arranged radially in the stiffened segment 110. The layers include: (a) a conductor layer including sheathed conductors; shielding layers, such as (b) inner jacket 703a and (c) outer jacket 703b; (d) stiffening layer with one or more stiffeners 704; flexible layers, including (e) wrapper layer 706, (f) inner grip layer 115, and (g) outer grip layer 116. Of course, other embodiments of a cable might have fewer layers or additional layers within the scope of the invention. Also, other forms of a stiffening layer are possible; for example, a stiffener 704 might consist of a tube of extruded material, such as copper or other metal alloy. In the case of the stiffener 704 wires such as illustrated in FIG. 7, there might be a any number of such wires, and they might be positioned in any arrangement longitudinally and/or azimuthally.

Figure 9:
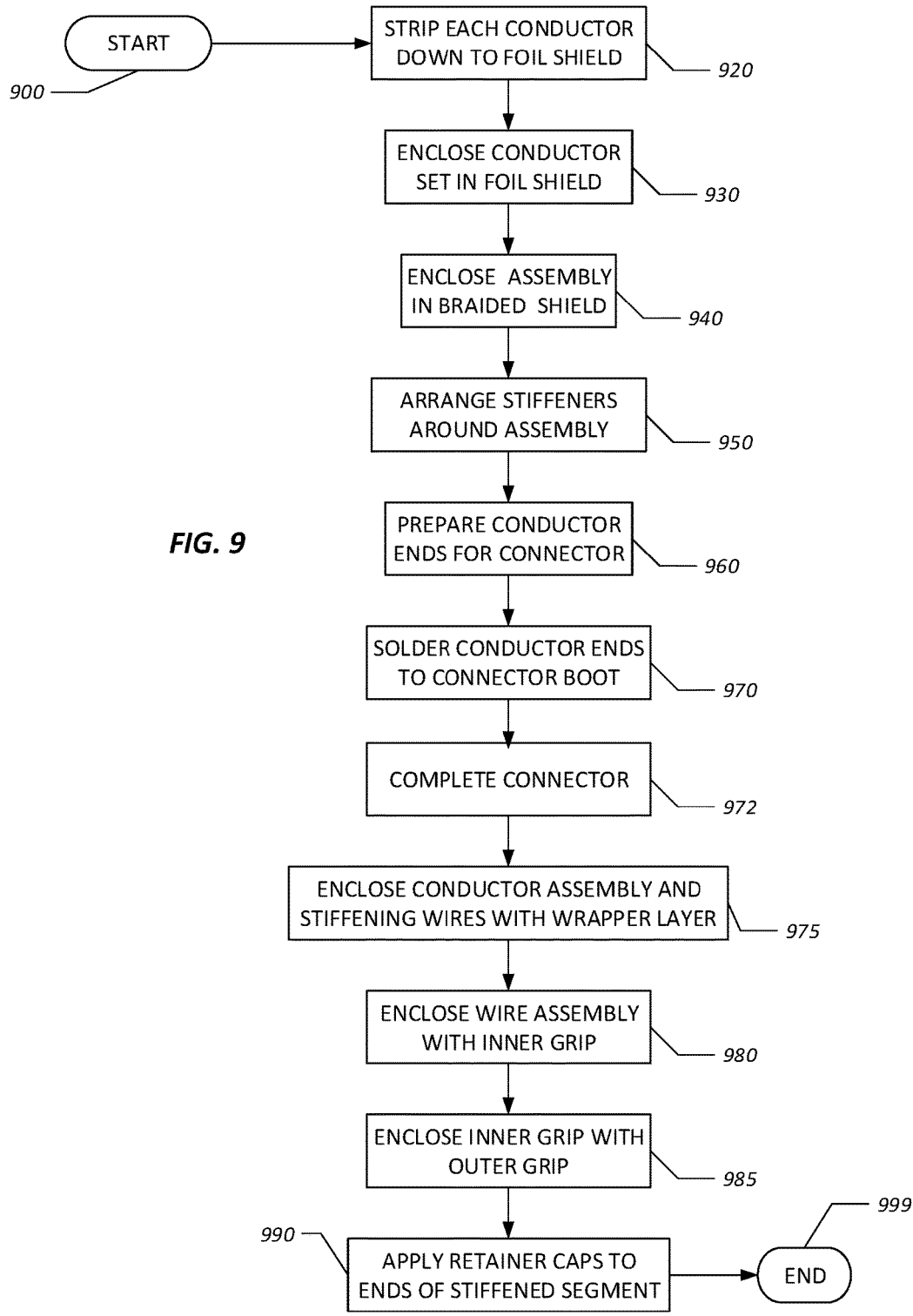
FIG. 9 is a flowchart of an exemplary process for assembling a cable that includes an integrated coiling and reinforcing wrapper.

FIG. 9 is a flowchart of an exemplary process for assembling a cable that includes an integrated coiling and reinforcing wrapper. After the start 900, each conductors is stripped 920 down to its foil shield. The set of conductors is then enclosed 930 in a foil shield. The foil shield, containing the conductors, is then wrapped 940 with a braided shield. Two stiffening wires are wrapped 950 around the stiffened segment along its length. The ends of the conductors are prepared 960 for the connector, and then soldered 970 in place to the connector, and assembly of the connector is completed 972. The conductor assembly and the stiffening wires are snugly enclosed 975 with an inner jacket of polymer, used for retention, preferably by injection molding. The inner jacket is enclosed 980 with a middle jacket to protect the inner jacket and other contents, preferably by injection molding. The middle jacket is enclosed 985 with an outer jacket that protects the middle jacket and other contents, preferably by injection molding. Retainer caps are attached 990 to the ends of the stiffened segment.

Of course, many variations of the above method are possible within the scope of the invention. The present invention is, therefore, not limited to all the above details, as modifications and variations may be made without departing from the intent or scope of the invention. Consequently, the invention should be limited only by the following claims and equivalent constructions.

What is claimed is:

1. An apparatus, comprising:
   a) a cable segment, having a proximal end, a distal end, and a length;
   b) a set of layers arranged radially within the segment, including
      (i) a conductor layer, including a first conductor adapted to carrying signal, data, information, electricity, power, light, sound, or video, in analog or digital form, and
      (ii) a stiffening layer, which is capable of being bent by hand and which, once bent into a shape, will retain that shape unless bent again.

2. The apparatus of claim 1, wherein the first conductor is formed by removing any layers outside a shield layer that prevents transmission of electromagnetic radiation.

3. The apparatus of claim 2, wherein the conductor layer includes a second conductor, the set of layers further including
   (iii) a first shield layer.

4. The apparatus of claim 3, wherein the first shield layer is a foil layer or a braided wire layer.

5. The apparatus of claim 1, the set of layers further including
   (iii) a second shield layer, which is a foil layer or a braided wire layer.

6. The apparatus of claim 1, the set of layers further including
   (iii) a first shield layer, which is a foil layer or a braided wire layer.

7. The apparatus of claim 1, wherein the stiffening layer includes a component of metal or metal alloy that extends along the length.

8. The apparatus of claim 7, wherein the first stiffening component includes a wire containing copper or a copper alloy.

9. The apparatus of claim 7, wherein the stiffening layer includes a second stiffening component, of metal or metal alloy, that is braided or intertwined with the first stiffening component.

10. The apparatus of claim 1, the set of layers further including
    (iii) a first flexible layer, which surrounds the conductor layer and the stiffening layer.

11. The apparatus of claim 10, wherein the first flexible layer is soft to the touch compared to a metal surface.

12. The apparatus of claim 10, wherein the first flexible layer is a first grip layer that is formed by injection molding of a polymer, rubber, or rubber composite and that surrounds the conductor layer and the stiffening layer.

13. The apparatus of claim 12, the set of layers further including
    (iii) a second flexible layer, which is formed by injection molding, and which spirals around the first flexible layer along the length of the segment.

14. The apparatus of claim 1, further comprising:
    c) an annulus-shaped cap at the proximal end, which retards longitudinal movement of contents of the set of layers.

15. The apparatus of claim 1, further comprising:
    c) a connector, to which the first conductor is attached, facilitating transmission through the first conductor.

16. The apparatus of claim 1, wherein the stiffening layer contains a polymer and a stiffening component.

17. The apparatus of claim 16, wherein the stiffening component is a wire.

18. The apparatus of claim 16, wherein the stiffening layer is formed by joint extrusion of the stiffening component together with a polymer.

* * * * *